United States Patent [19]
Arakawa et al.

[11] Patent Number: 6,031,202
[45] Date of Patent: Feb. 29, 2000

[54] LASER MARKING APPARATUS AND METHOD FOR CONTROLLING SAME

[75] Inventors: Isao Arakawa; Tatsuya Urata; Shinichi Matsumura; Tetsuji Miyamoto, all of Kumamoto, Japan

[73] Assignee: Mitsubishi Denki Kabushiki Kaisha, Tokyo, Japan

[21] Appl. No.: 09/079,551

[22] Filed: May 15, 1998

[30] Foreign Application Priority Data

Nov. 28, 1997 [JP] Japan .................................. 9-328747

[51] Int. Cl.⁷ .................................................. B23K 26/00
[52] U.S. Cl. ............................... 219/121.68; 219/121.82
[58] Field of Search ..................... 219/121.68, 121.69, 219/121.83, 121.82; 29/25.01; 198/345.1; 414/417; 347/262

[56] References Cited

U.S. PATENT DOCUMENTS

| | | | |
|---|---|---|---|
| 4,638,144 | 1/1987 | Latta, Jr. ............................. | 219/121.68 |
| 5,332,405 | 7/1994 | Golomb ................................ | 29/25.01 |
| 5,357,077 | 10/1994 | Tsuruta ................................ | 219/121.68 |
| 5,520,276 | 5/1996 | Aoki et al. .......................... | 198/345.1 |
| 5,629,484 | 5/1997 | Liska .................................. | 219/121.68 |
| 5,645,393 | 7/1997 | Ishii .................................... | 414/417 |
| 5,670,068 | 9/1997 | Kuriyama et al. ................. | 219/121.68 |
| 5,838,361 | 11/1998 | Corbett ................................ | 347/262 |

FOREIGN PATENT DOCUMENTS 3-276652  12/1991  Japan .

*Primary Examiner*—Geoffrey S. Evans
*Attorney, Agent, or Firm*—Leydig, Voit & Mayer, Ltd.

[57] ABSTRACT

In a laser marking apparatus, a rotatable index table is provided in an index unit. The index table is provided with first and second support sections for supporting lead frames. Positions of the first and second sections are alternately switched between a stand-by position and a processing position by the rotation of the index table. Laser marking is subjected to IC package surfaces of the lead frame supported at the support potions located at the processing position. The lead frames after the laser marking process are transported from the stand-by position to a discharging section by a transporting device. The lead frames before the laser marking process are transported from a supplying section to the stand-by position by the transporting device.

12 Claims, 15 Drawing Sheets

LASER MARKING APPARATUS AND METHOD FOR CONTROLLING SAME

BACKGROUND OF THE INVENTION

1. Field of the Invention

The present invention relates to a laser marking apparatus for a semiconductor device manufacturing process and a method for controlling same that uses irradiated laser light to mark the package surface of a lead frame into which IC devices are molded.

2. Description of the Related Art

FIG. 16 is a perspective view showing an example of a conventional laser marking apparatus. In FIG. 16, the laser marking apparatus is provided with a supplying section 1, a conveyor section 2, a discharging section 3 and a laser irradiating section 4. A plurality of magazines 6, each of which receives a plurality of molded lead frames 5, are provided in the supplying section 1.

In the conveyor section 2, the lead frames 5 are conveyed through, a pre-processing stand-by position 2A, a processing position 2B and a post-processing stand-by position 2C. A positioning mechanism 7 for positioning the lead frames 5 at the processing position 2B is provided in the conveyor section 2. The plurality of magazines 6 into which the lead frames 5 that have been processed are received are disposed in the discharging section 3.

The operation will now be described. The lead frames 5 within the magazines 6 disposed in the supplying section 1 are transported one by one to the pre-processing stand-by position 2A of the conveyor section 2 by a supplying mechanism (not shown). Thereafter, the lead frame 5 is conveyed to the processing position 2B. Then, after the positioning has been performed by the positioning mechanism 7, the surface of a package portion (not shown) of each lead frame 5 is subjected to a laser marking process by the laser irradiating section 4. Processed lead frames 5 are conveyed to the post-processing stand-by position 2C, and are stored in the magazine 6 of the discharging section 3 by a discharging mechanism (not shown).

In the thus arranged conventional laser marking apparatus, the lead frames 5 are conveyed through the supplying section 1, the pre-processing stand-by position 2A, the processing position 2B, the post-processing stand-by position 2C and the discharging section 3. However, the conveying path is arranged in a straight line, resulting in an enlargement of the entire apparatus. In addition the supplying mechanism and the discharging mechanism are provided separately which also leads to an enlargement of the entire apparatus. Furthermore, since the laser marking process is performed after positioning the lead frame 5 that has been conveyed to the processing position 2B, the time for the lead frames 5 are stopped at the processing position 2B is increased and so a long time is required to mark the IC package surfaces of a large number of lead frames 5.

SUMMARY OF THE INVENTION

In order to overcome the above-noted defects, an object of the present invention is to provide a laser marking apparatus and a method for controlling same, wherein the overall size and the processing time may be decreased.

To this end, according to one aspect of the present invention, there is provided a laser marking apparatus comprising: a supplying section for supplying a plurality of lead frames into which IC devices are molded; an index unit having a rotatable index table provided with first and second support sections for supporting the lead frames that have been supplied from the supplying section, for alternately switching positions of the first and second support sections between a stand-by position and a processing position by rotating the index table; a laser irradiating section for performing a laser marking process at the processing position to surfaces of the IC packages of the lead frames supported by the first and second support sections; a discharging section for receiving the lead frames that have been processed by the laser marking; a transporting device for transporting the lead frames, after the laser marking process, from the stand-by position to the discharging section and transporting the lead frames, before the laser marking process, from the supplying section to the stand-by position; and a controlling section for controlling operation of the supplying section, the index unit, the laser irradiating section, the discharging section and the transporting device.

According to another aspect of the present invention, there is provided a method for controlling a laser marking apparatus having an index unit with a rotatable index table provided with first and second support sections for supporting lead frames, for alternately switching positions of said first and second support sections between a stand-by position and a processing position by rotating said index table, comprising, while laser marking IC package surfaces of the lead frames held in the processing position, the steps of: discharging the lead frames, after the laser marking process, from the stand-by position; and supplying and positioning the lead frames, before the laser marking process, to the stand-by position.

DETAILED DESCRIPTION OF THE PREFERRED EMBODIMENTS

An embodiment of the present invention will now be described with reference to the accompanying drawings.

Figure 1:
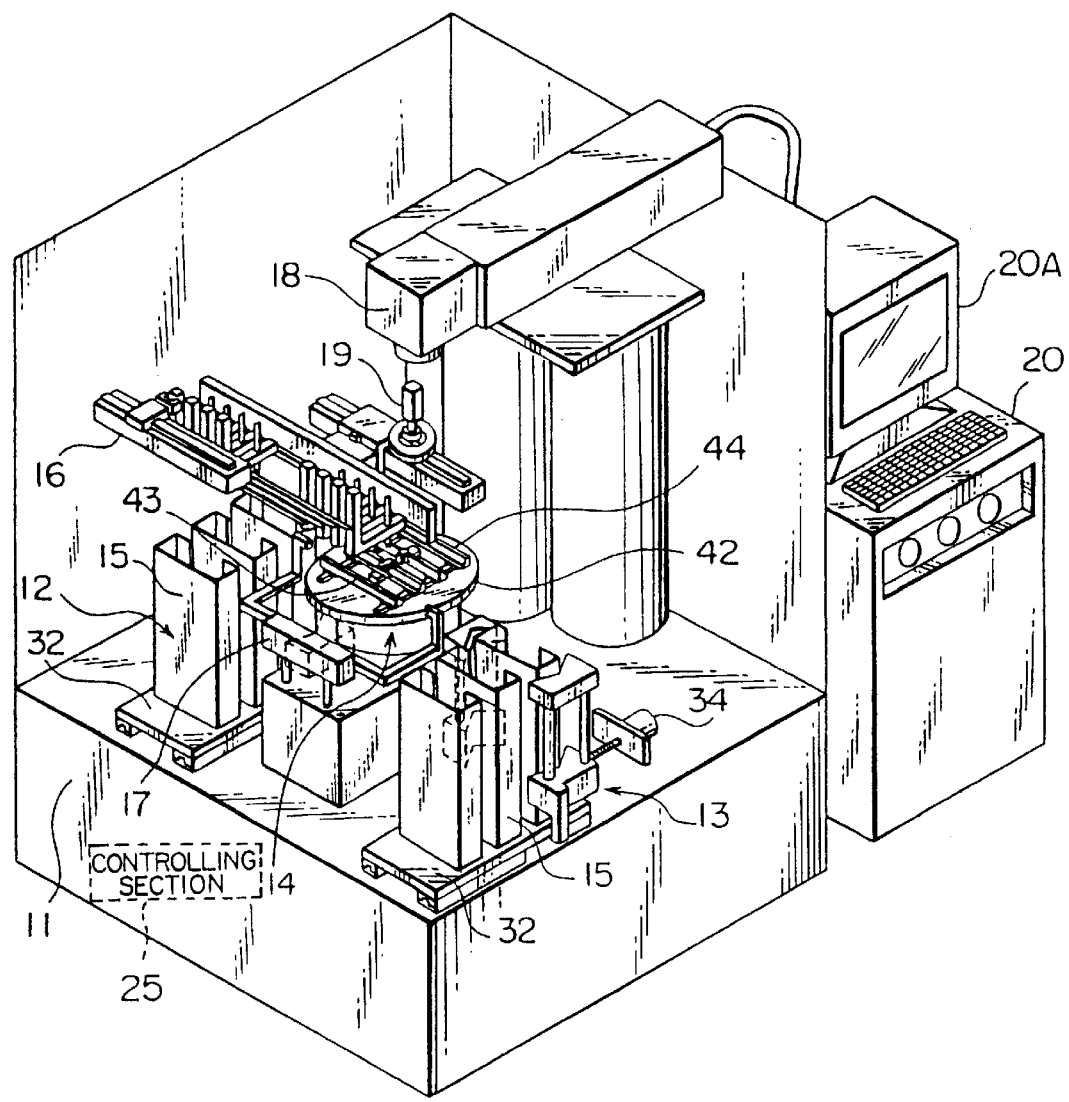
FIG. 1 is a perspective view showing a laser marking apparatus in accordance with an embodiment of the present invention.
Figure 2:
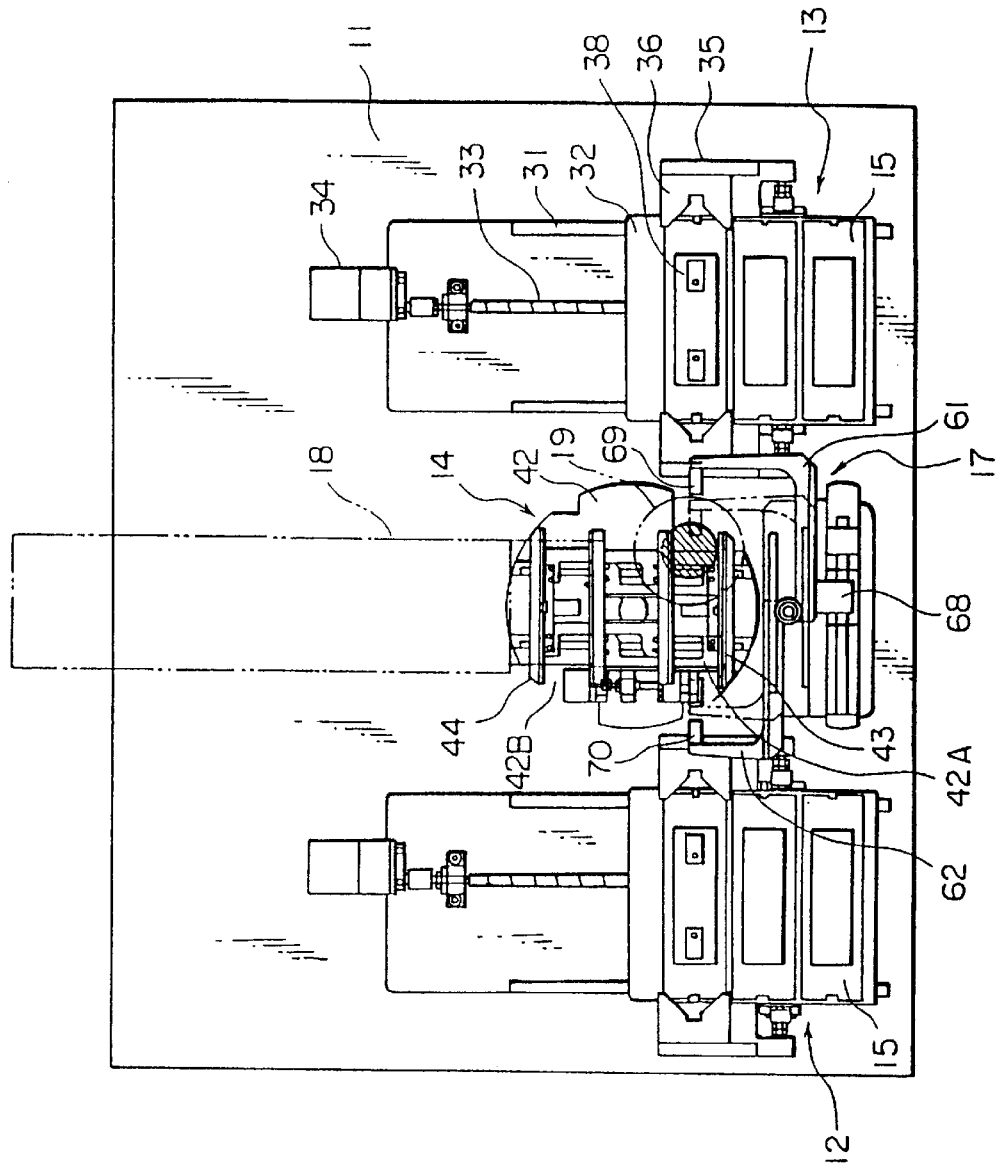
FIG. 2 is a plan view showing an essential portion of FIG. 1.

FIG. 1 is a perspective view showing a laser marking apparatus in accordance with an embodiment of the present invention and FIG. 2 is a plan view showing an essential portion shown in FIG. 1. In FIGS. 1 and 2, a supplying section 12 and a discharging section 13 which have like structures are provided on a base 11. An index unit 14 is provided between the supplying section 12 and the discharging section 13. A plurality of magazines 15 which may receive a plurality of lead frames 21 (FIG. 3) into which IC devices (not shown) have been molded, respectively, are positioned on the supplying section 12 and the discharging section 13.

A transporting device 16 for transporting the lead frames 21 is provided above the supplying section 12, the discharging section 13 and the index unit 14. A frame positioning mechanism 17 for positioning the lead frame 21 on the index unit 14 in the longitudinal direction is provided in the vicinity of the index unit 14. A laser irradiating section (laser marker) 18 for performing the laser marking process on an IC package surface (to be described later) of the lead frame 21 and an image detecting device 19 for detecting an image of the lead frame 21 are provided above the index unit 14. Incidentally, in FIG. 1, support members for the transporting device 16 and the image detecting device 19 to the base 11 are omitted. A power source unit 20 for driving the laser irradiating section 18 is provided at the side of the base 11. A monitor 20A is provided on the power source unit 20. A controlling section 25 for controlling the equipment on the base 11 is provided within the base 11.

Figure 3:
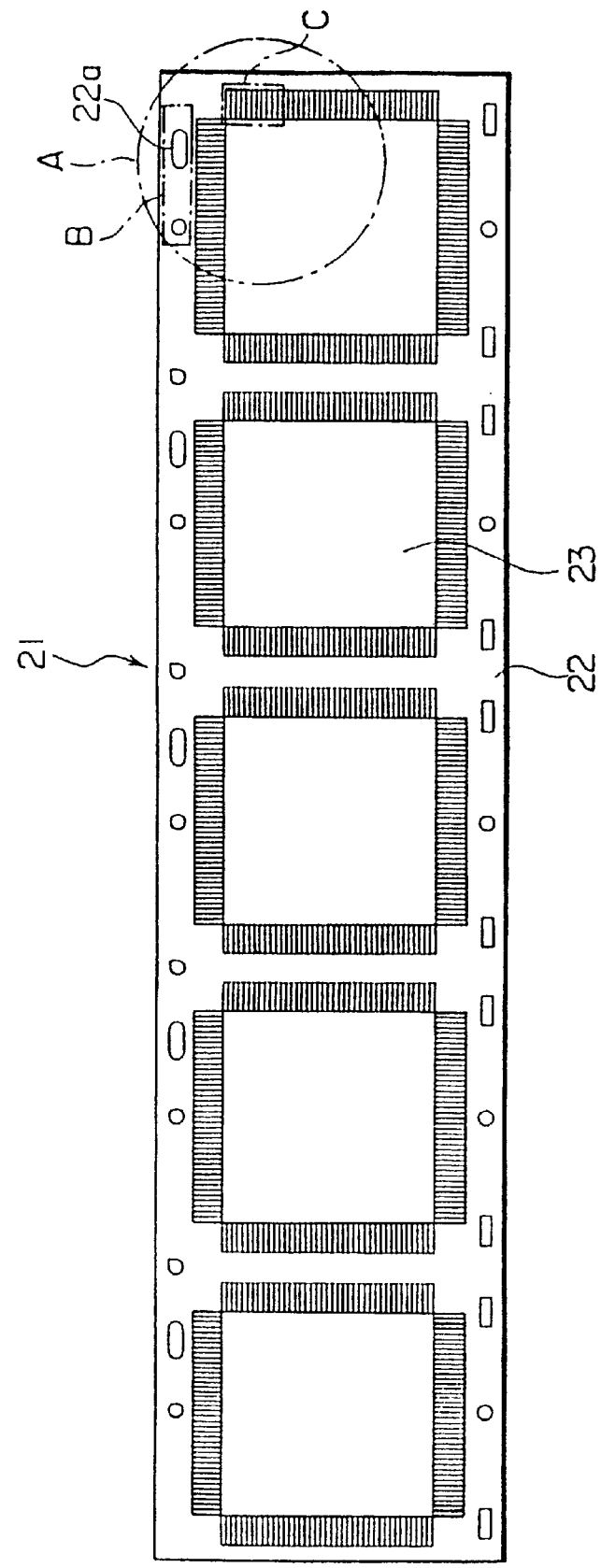
FIG. 3 is a plan view showing one example of a lead frame to be processed in the apparatus shown in FIG. 1.

Next, FIG. 3 is a plan view showing one example of the lead frame 21 having package portions to be processed by the apparatus shown in FIG. 1. In FIG. 3, the lead frame 21 has a lead frame body 22 made of metal and a plurality of package portions 23 in which IC devices are molded into the lead frame body 22. In this example, a top surface of each package portion 23, which is an IC package surface, is subjected to the laser marking process. Elongated holes 22a for detecting the two sides of the lead frame 21 are provided on the lead frame body 22.

Figure 4:
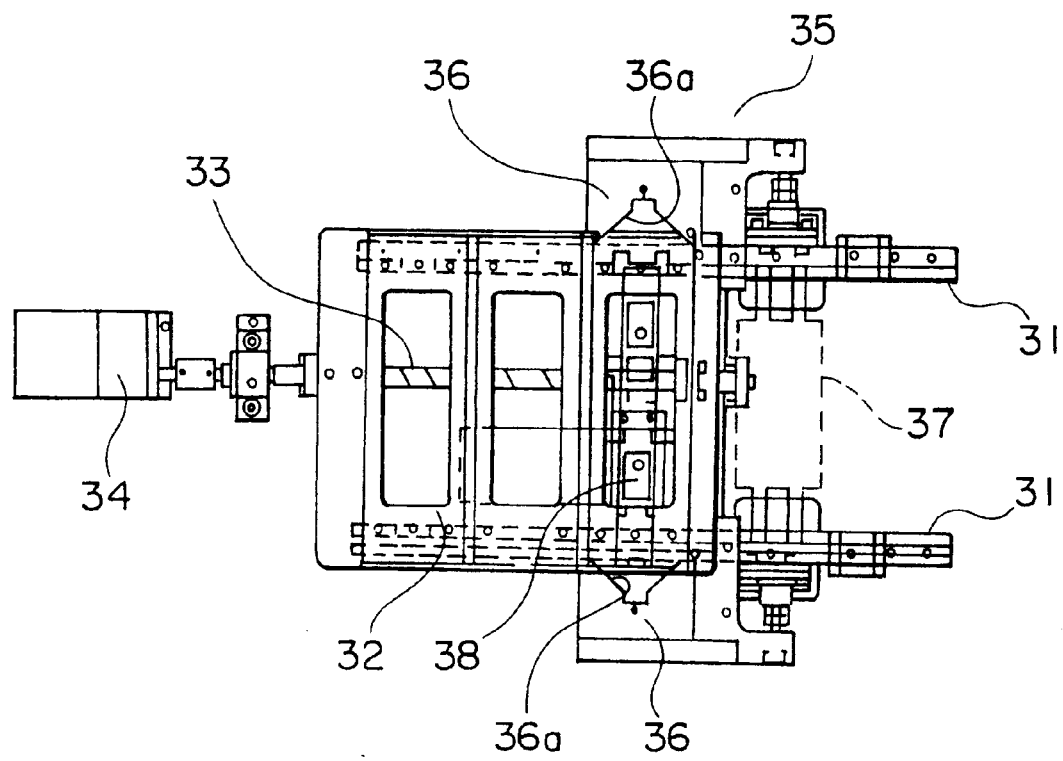
FIG. 4 is a plan view showing the supplying section and a discharging section shown in FIG. 1.
Figure 5:
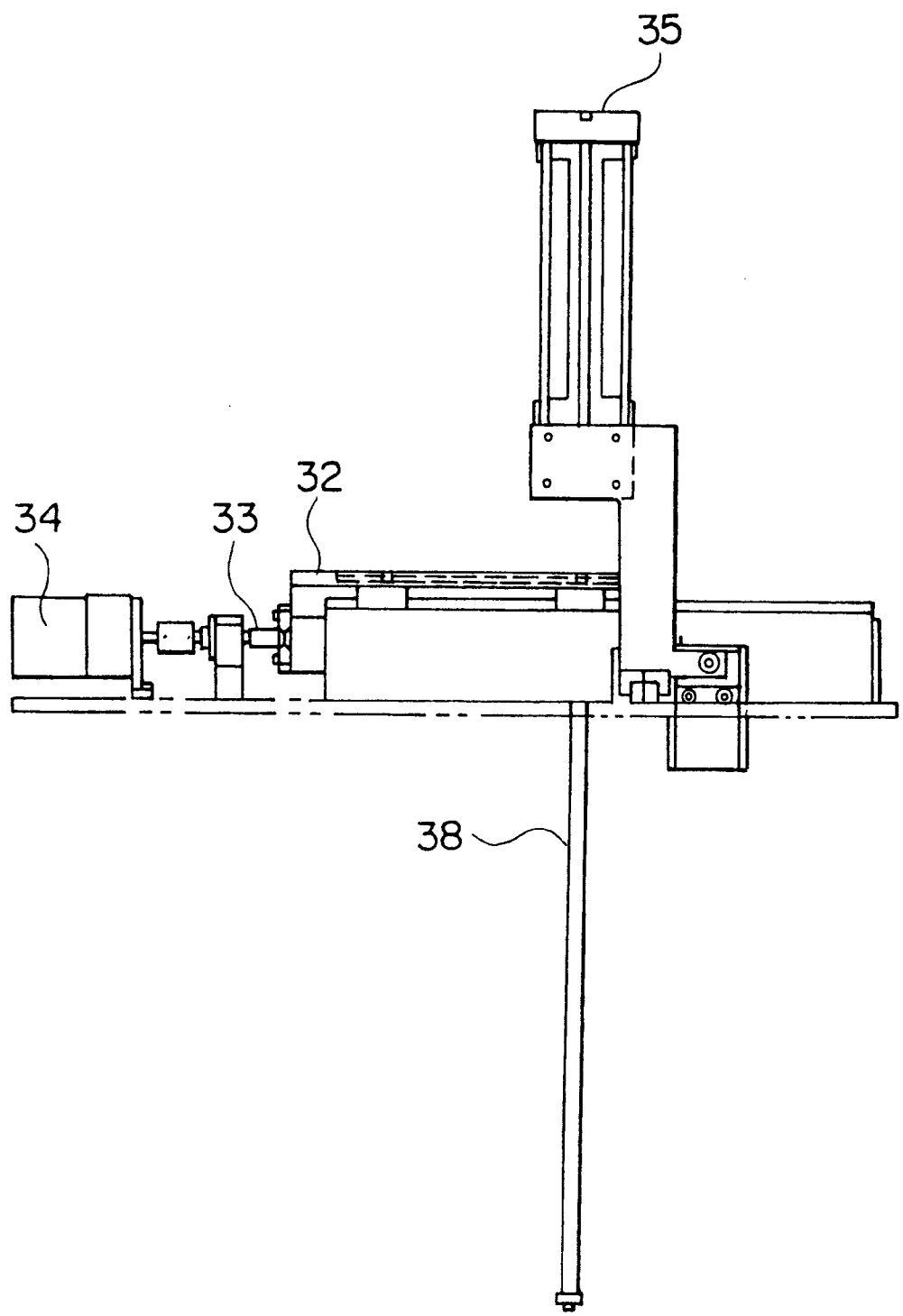
FIG. 5 is a side elevational view of FIG. 4.
Figure 6:
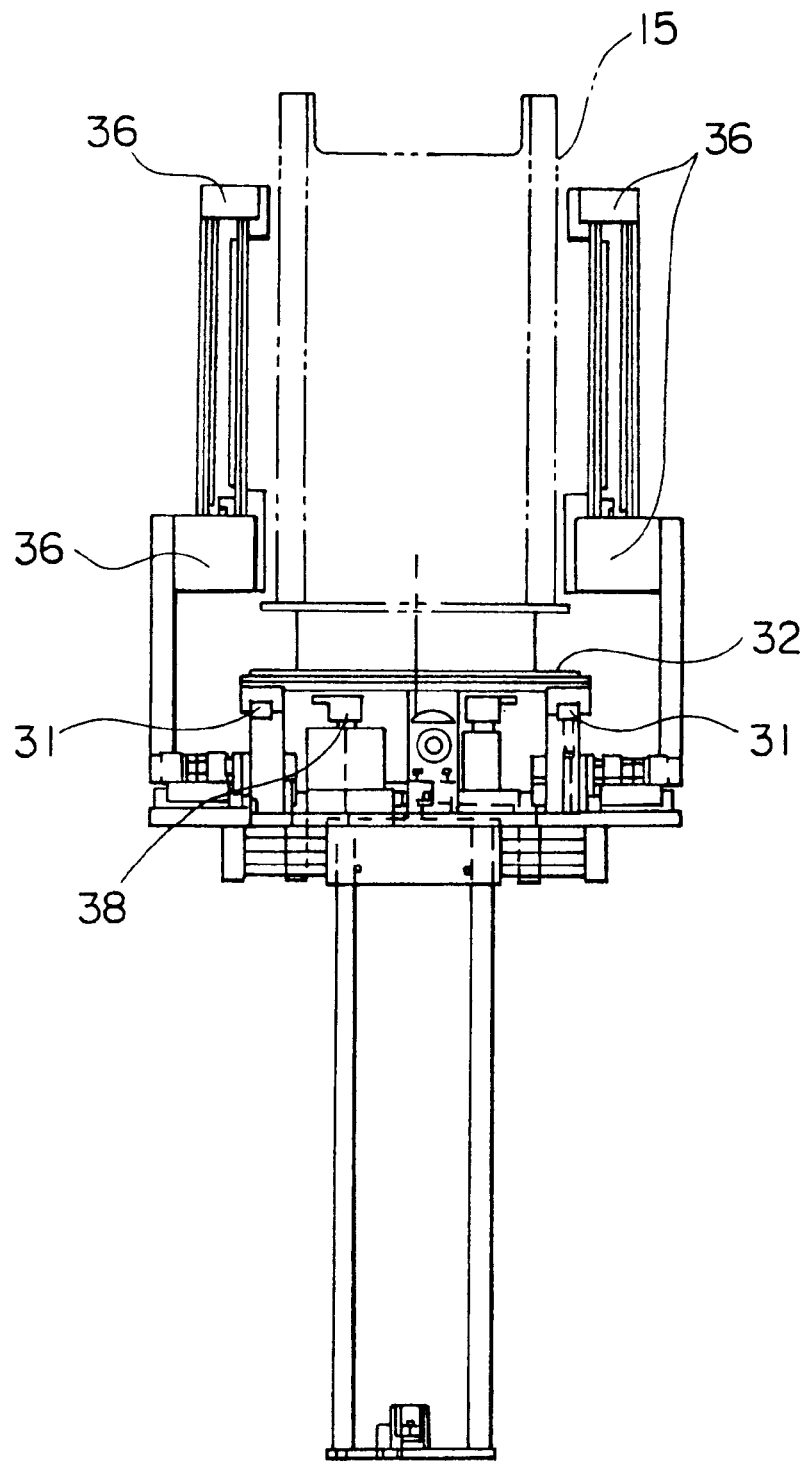
FIG. 6 is a frontal view of FIG. 5.

Further, FIG. 4 is a plan view showing the supplying section 12 and the discharging section 13 shown in FIG. 1, FIG. 5 is a side elevational view of FIG. 4, and FIG. 6 is a frontal view of FIG. 5. In these drawings, a pair of guide rails 31 are fixed to the base 11. A magazine table 32 which reciprocates along and is guided by the guide rails 31 is provided on the guide rails 31. The magazines 15 are arranged in line on the magazine table 32. The magazine table 32 is reciprocated by the rotation of a ball screw 33. Also, the ball screw 33 is rotated by a motor 34.

The magazines 15 on the magazine table 32 are positioned relative to the transporting device 16 by the magazine positioning mechanism 35. Magazine positioning claws 36 provided with taper surfaces 36a for clamping and positioning the magazine 15 are provided in the magazine positioning mechanism 35. The magazine positioning claws 36 at both sides of the magazine 15 are opened and closed by an air chuck 37. A frame lifter 38 for raising and lowering a bundle of the lead frames 21 within the magazine 15 through a bottom portion of the magazine 15 and the magazine table 32 is provided below the magazine table 32.

Figure 7:
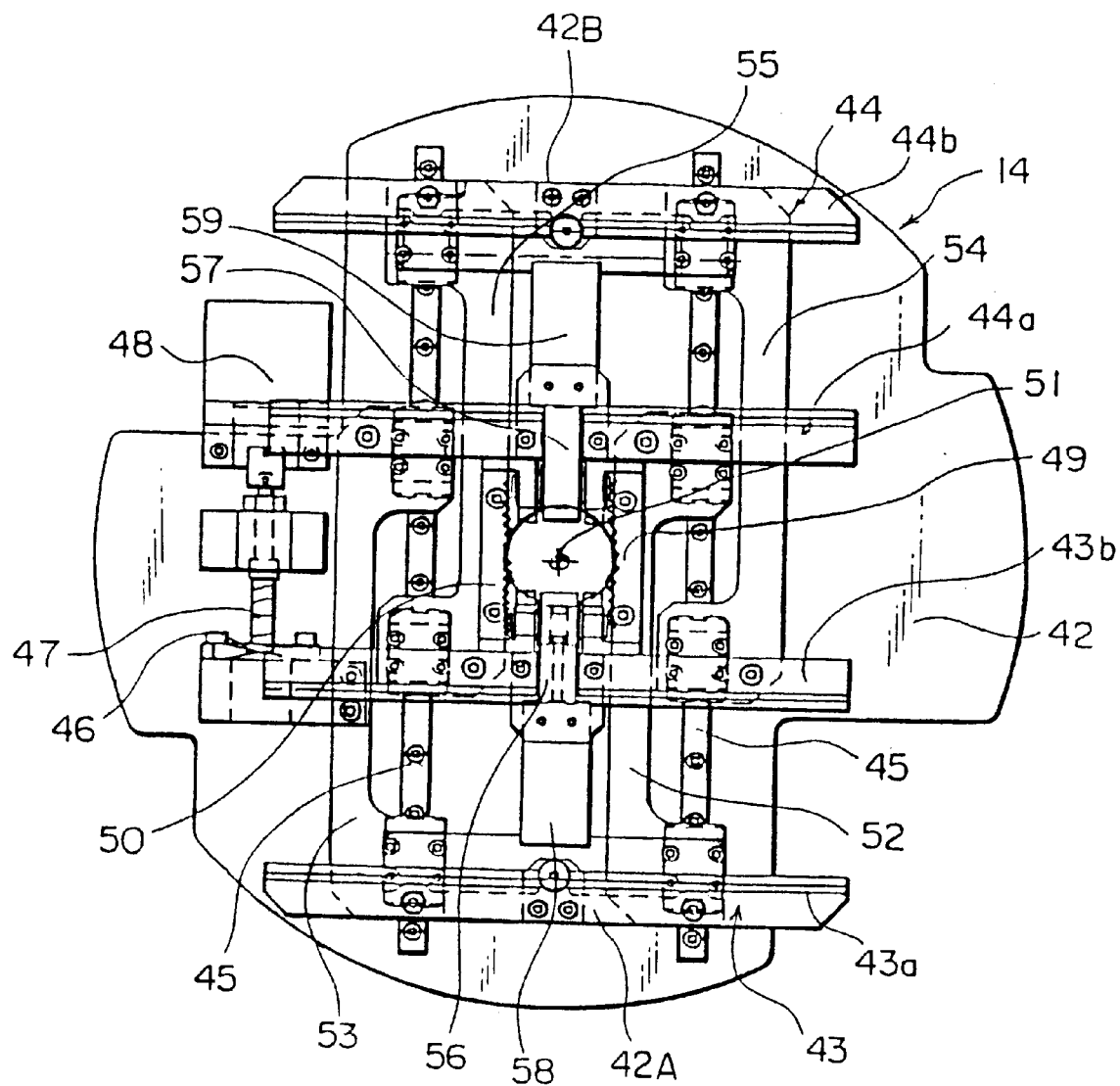
FIG. 7 is a plan view showing the index unit shown in FIG. 1.
Figure 8:
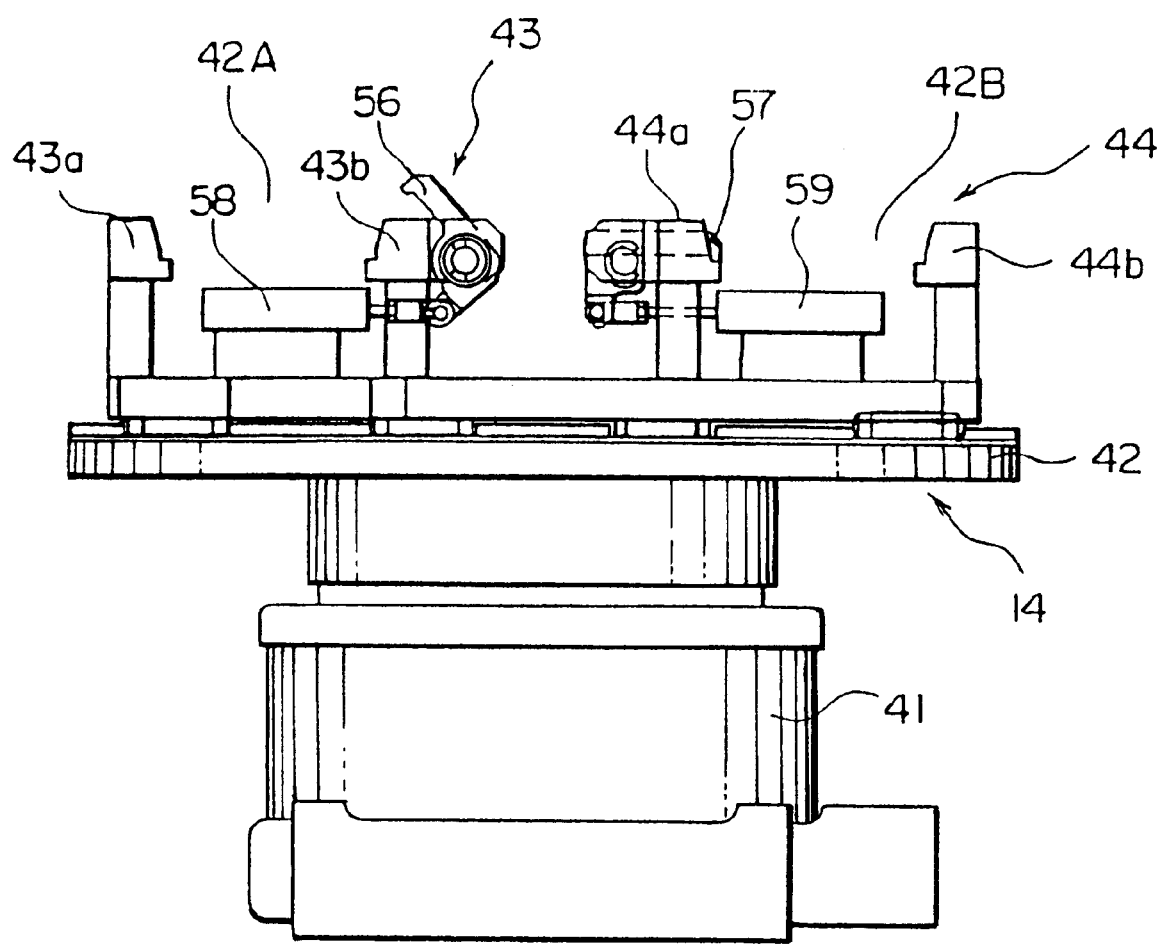
FIG. 8 is a frontal view of the index unit as viewed from the right of FIG. 7.
Figure 9:
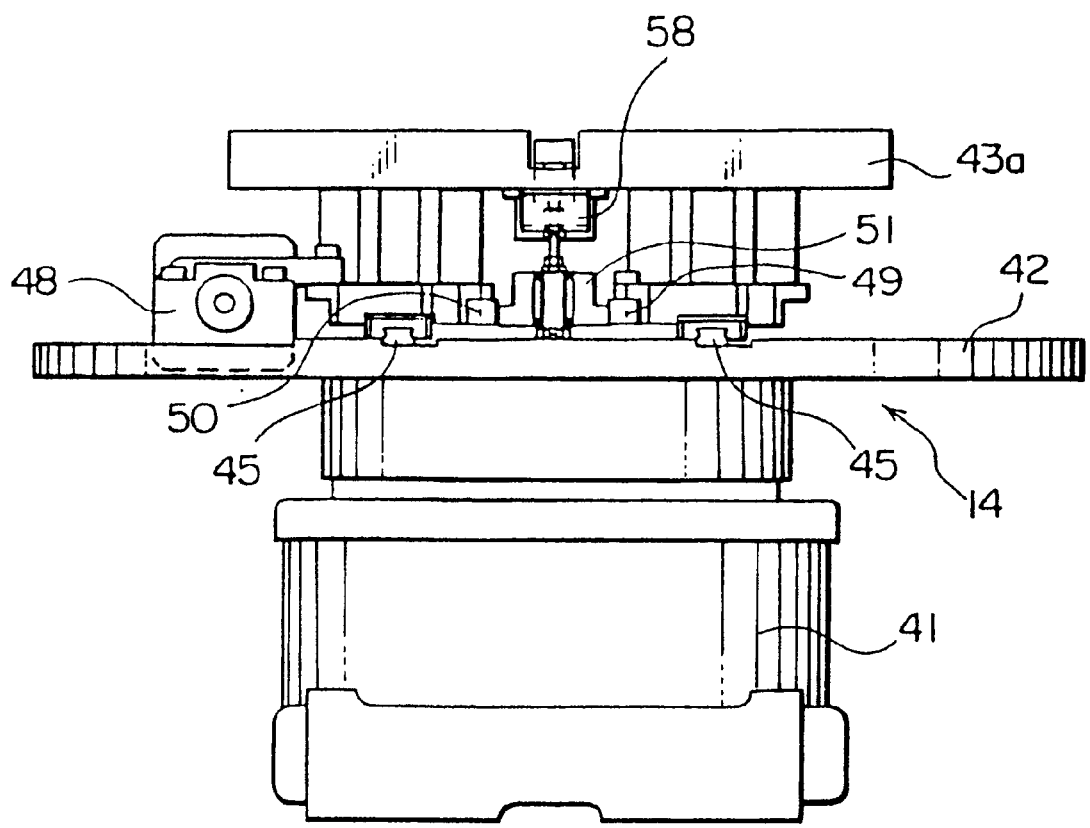
FIG. 9 is a left side elevational view of FIG. 8.

Next, FIG. 7 is a plan view showing the index unit 14 shown in FIG. 1, FIG. 8 is a frontal view of the index unit of FIG. 7 as viewed from the right, and FIG. 9 is a left side elevational view of FIG. 8. In these drawings, the index unit 14 has a unit body 41 fixed to the base 11 and an index table 42 on a disc which is rotatably provided on the unit body 41.

A first support section 43 and a second support section 44 for supporting the lead frame 21 are provided on the index table 42. The positions of the first and second support sections 43 and 44 may be alternately switched between a stand-by position 42A and a processing position 42B by rotating the index table 42 through 180°.

The first and second support sections 43 and 44 have a pair of frame receivers 43a and 43b and a pair of frame receivers 44a and 44b, respectively. These frame receivers 43a, 43b, 44a and 44b are movable in the vertical direction in FIG. 7 (horizontal direction in FIG. 8) along the pair of guide rails 45, whereby it is possible to adjust the distance between the frame receivers 43a and 43b and the distance between the frame receivers 44a and 44b in response to the width of the lead frame 21.

A nut member 46 is fixed to the frame receiver 43b, and a ball screw 47 is threadably engaged with the nut member 46. The ball screw 47 is rotated by a stepping motor 48 fixed to the index table 42 so that the frame receiver 43b is reciprocated along the guide rails 45. Also, first and second racks 49 and 50 are fixed to the frame receivers 43b and 44a. A freely rotatable gear 51 is provided at a central portion of the index table 42. The racks 49 and 50 are engaged with the gear 51. Thus, the frame receiver 44a is moved in synchronism with and in the opposite direction of the frame receiver 43b.

The frame receivers 43a and 44a are connected to each other through joint plates 52 and 53. The frame receivers 43b and 44b are connected to each other through joint plates 54 and 55. Thus, all the frame receivers 43a, 43b, 44a and 44b are moved in synchronism with each other by the driving of the stepping motor 48.

Clampers 56 and 57 are rotatably mounted on the first and second support sections 43 and 44 for clamping and holding the end sections of the lead frame 21 between the frame receivers 43b and 44b. These clampers 56 and 57 are rotated by air cylinders 58 and 59 fixed to the index table 42.

Figure 10:
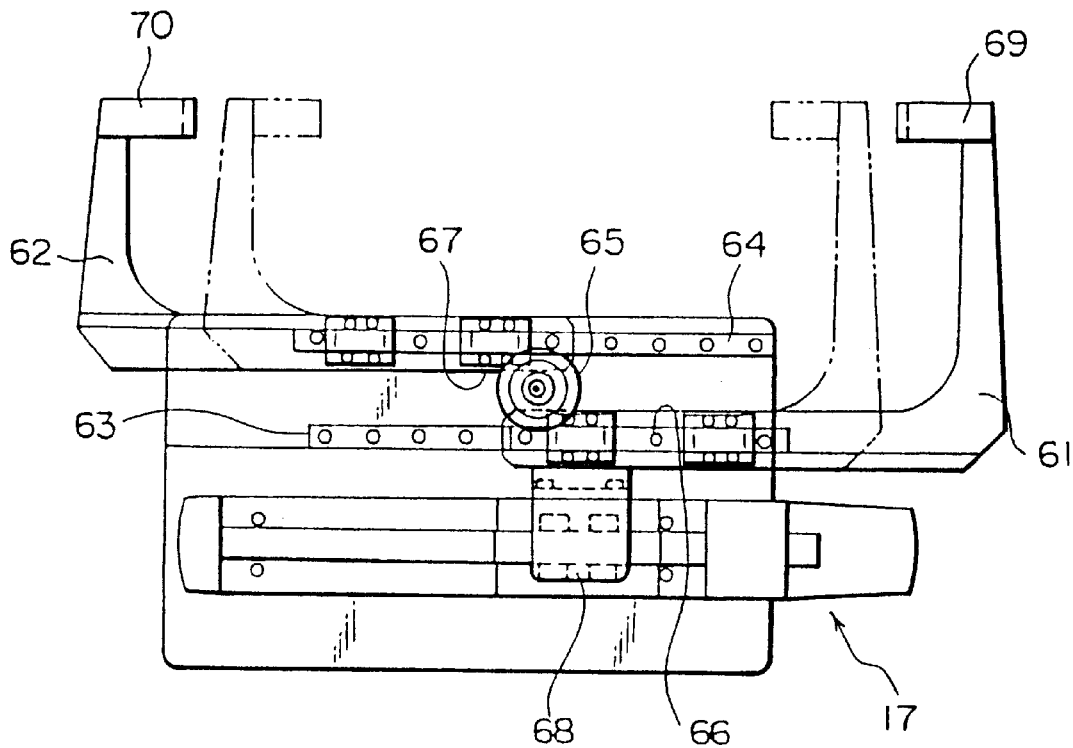
FIG. 10 is a plan view showing a frame positioning mechanism shown in FIG. 1.
Figure 11:
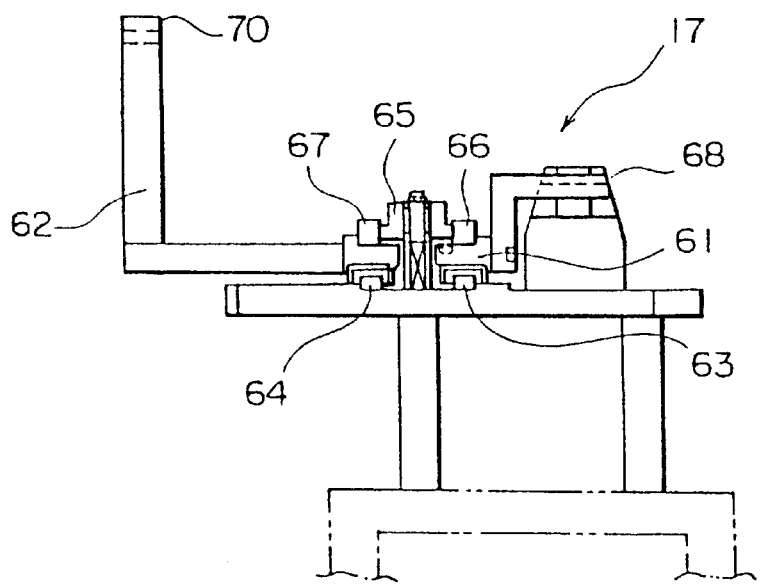
FIG. 11 is a left side elevational view of FIG. 10.
Figure 12:
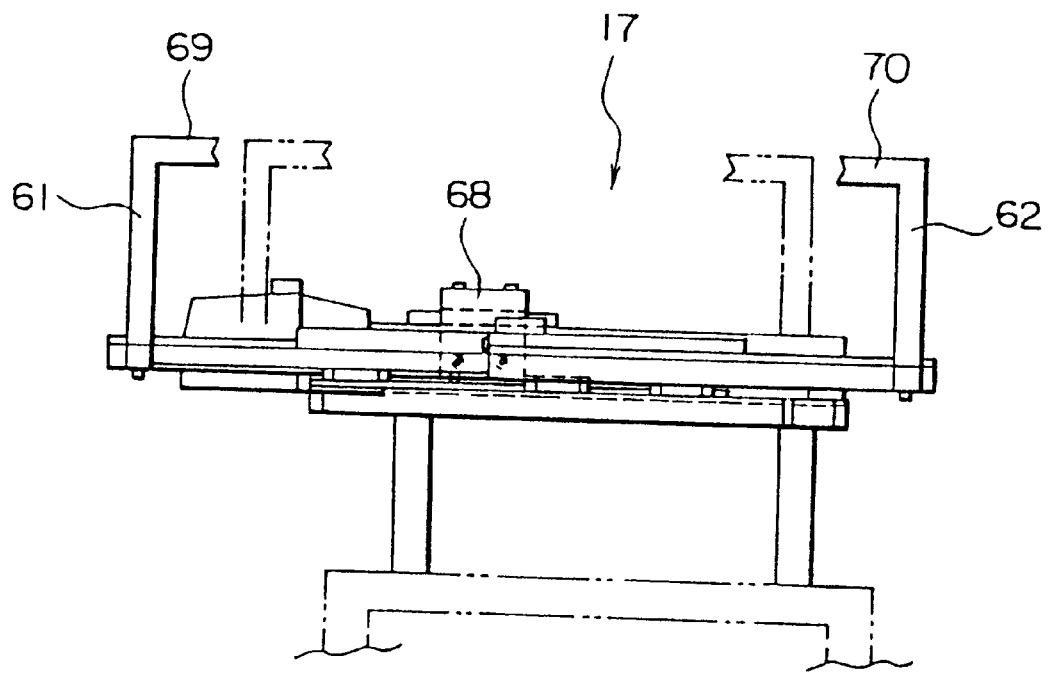
FIG. 12 is a frontal view of FIG. 11 as viewed from the left.

Next, FIG. 10 is a plan view showing the frame positioning mechanism 17, FIG. 11 is a left side elevational view of FIG. 10, and FIG. 12 is a frontal view as viewed from the left of FIG. 11. In these drawings, a pair of arms 61 and 62 are reciprocated in the horizontal direction in FIG. 10 along guide rails 63 and 64. A rotatable pinion 65 is provided between the arms 61 and 62, and racks 66 and 67 that engage with the pinion 65 are provided on the arms 61 and 62. Thus, the arm 62 is linked to and moved by the arm 61. The arm 61 is moved by a servo actuator 68.

A pair of frame positioning claws 69 and 70 for positioning the lead frame 21 are provided at top end portions of the arm 61 and 62 and brought into contact with both ends in the longitudinal direction of the lead frame 21 positioned at the stand-by position 42A. When the arm 61 is moved by the servo actuator 68, the arm 62 is moved in the opposite direction so that the frame positioning claws 69 and 70 are opened and closed. If the distance between the positioning claws 69 and 70 upon positioning is too great, positioning of the lead frame cannot be performed. On the other hand, if the distance is excessively short, the lead frame 21 is pressed. Therefore, intervals according to the type (length) of lead frame 21 are stored in the controlling section 25. Then, upon positioning, the positioning claws 69 and 70 are stopped at the desired closed position under the control of the controlling section 25.

Figure 13:
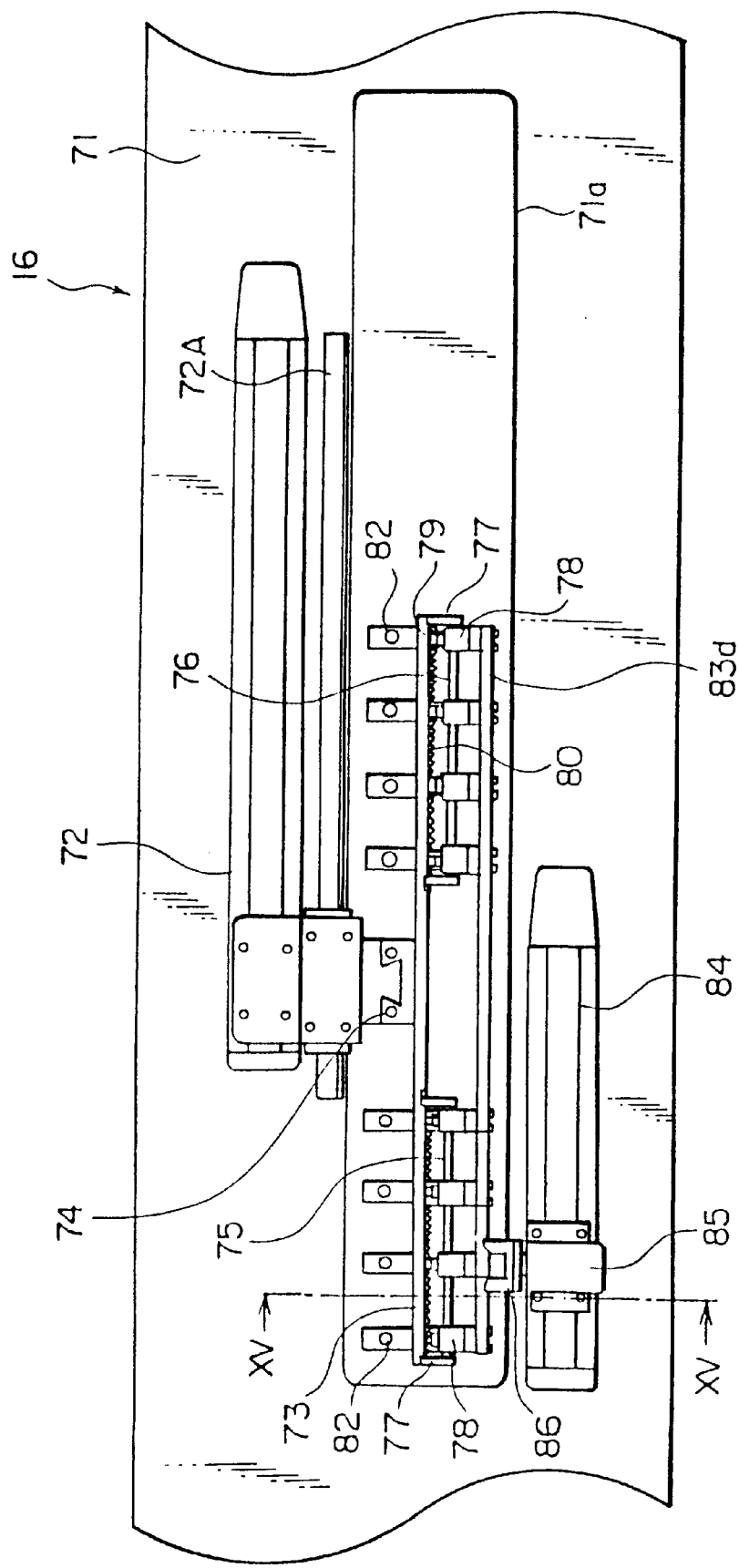
FIG. 13 is a plan view showing the transporting device shown in FIG. 1.
Figure 14:
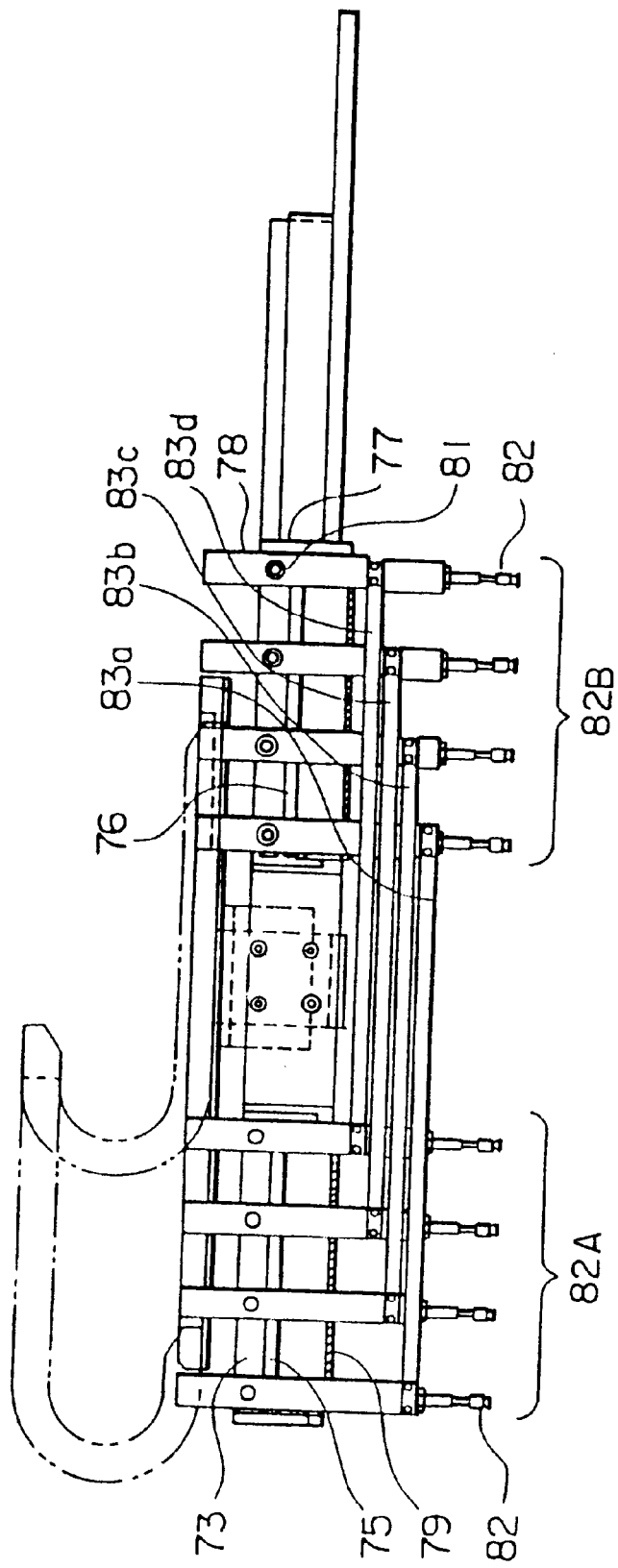
FIG. 14 is a frontal view showing an essential portion of FIG. 13.
Figure 15:
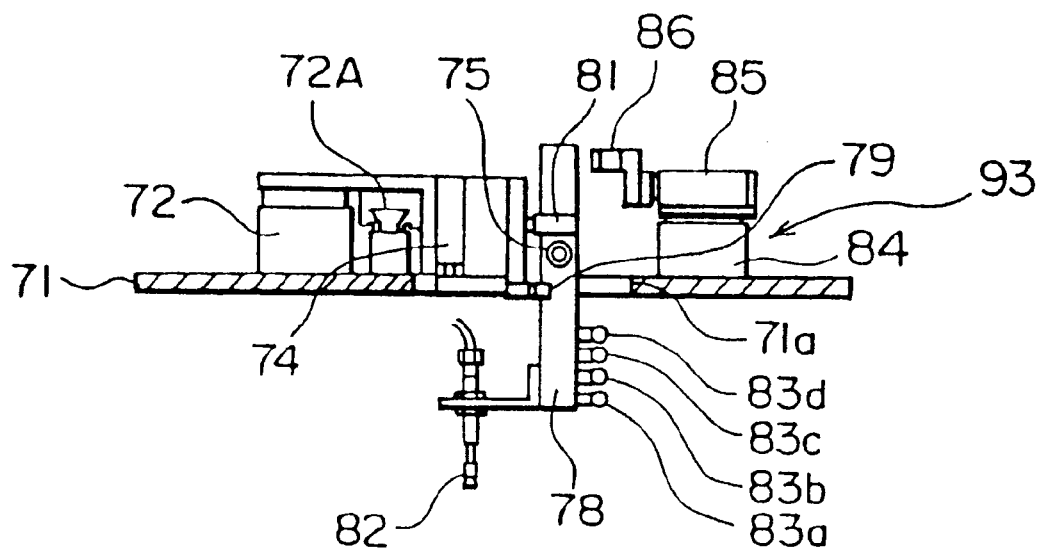
FIG. 15 is a cross-sectional view taken along the line XV—XV of FIG. 13.
Figure 16:
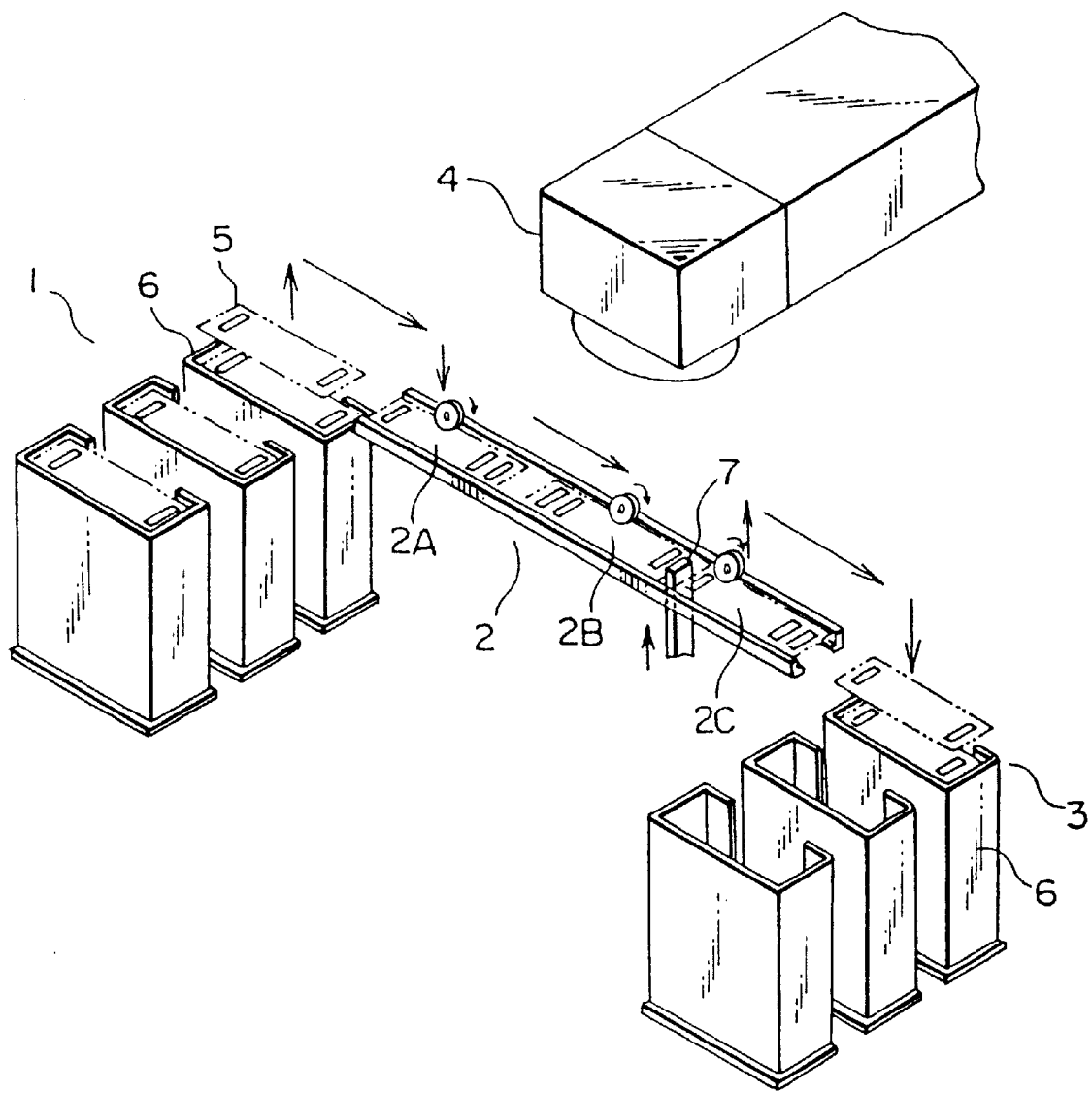
FIG. 16 is a perspective view showing one example of a conventional laser marking apparatus.

Further, FIG. 13 is a plan view showing the transporting device 16 shown in FIG. 1, FIG. 14 is a frontal view showing an essential portion of FIG. 13, and FIG. 15 is a cross-sectional view taken along the line XV—XV of FIG. 13. In these drawings, a servo actuator 72 and a guide rail 72A are provided on a support plate 71. A frame conveyor plate 73 is reciprocated by the servo actuator 72 in the horizontal direction in FIG. 13 along the guide rail 72A. An elevating air cylinder 74 for moving the frame conveyor plate 73 vertically is provided between the servo actuator 72 and the frame conveyor plate 73.

A pair of slide shafts 75 and 76 are fixed to the frame conveyor plate 73 at an interval from each other in the same axis. The slide shafts 75 and 76 are mounted on the frame conveyor plate 73 through a plurality of shaft support plates 77, respectively. Four pad support members 78 passing through an opening portion 71a of the support plate 71 are slidably mounted, respectively, on the slide shafts 75 and 76.

A pad side rack 79 is provided on each pad support member 78, and these pad side racks 79 are engaged with a pitch fixing rack 80 provided on the frame conveyor plate 73. Also, a ball plunger 81 for biasing the pad side rack 79 toward the pitch fixing rack 80 is mounted on each pad support member 78 by depressing the frame conveyor plate 73.

A suction pad 82 for sucking and holding the lead frame 21 is mounted on each pad support member 78. Also, as shown in FIG. 14, a first suction pad group 82A is constituted by the four suction pads 82 mounted on-the pad support members 78 slidably movable along the slide shaft 75. In the same manner, a second suction pad group 82B is constituted by the four suction pads 82 mounted on the pad support members 78 slidably movable along the slide shaft 76. The lead frame 21 is moved from the supplying section 12 to the stand-by position 42A by the first suction pad group 82A, and discharged from the stand-by position 42A to the discharging section 13 by the second suction pad group 82B.

The suction pads 82 of the second suction pad group 82B are connected to the corresponding suction pads 82 of the first suction pad group 82A through joint members 83a to 83a. Accordingly, the suction pads 82 connected through the joint members 83a to 83a are always slidably moved the same distance and in the same direction on the slide shafts 75 and 76.

A servo actuator 84 for shifting the pads is provided on the support plate 71. An air cylinder 85 is moved in the horizontal direction in FIG. 13 by the servo actuator 84 for shifting the pads. A holder 86 which engages with an upper end portion of the pad support member 78 is provided on the air cylinder 85.

When the distance between the suction pads 82 is changed in accordance with a change of the type of lead frame 21, the holder 86 is moved upward (in FIG. 13) by the air cylinder 85 and engaged with the pad support member 78. The pad support member 78 is pressed by the holder 86, and is rotated against the ball plunger 81 to thereby separate the pad side rack 79 from the pitch fixing rack 80. In this condition, the air cylinder 85 is moved by the pad shifting servo actuator 84 so that the pad support member 78 is slidably moved along the slide shaft 75.

After the pad support member 78 has been slidingly moved up to a desired position, the holder 86 is retracted so that the pad side rack 79 is engaged with the pitch fixing rack 80 and the position of the pad support member 78 in the axial direction of the slide shaft 75 is fixed. Thus, the distance between the suction pads 82 of the second suction pad group 82B are automatically adjusted by adjusting the distance between the suction pads 82 of the first suction pad group 82A. Incidentally, the pad side rack 79, the pitch fixing rack 80 and the ball plunger 81 need only be provided on the side of the first suction pad group 82A.

The overall operation of the apparatus will now be explained. The lead frame 21 before processing (before laser marking the IC package surface) stored in the magazine 15 of the supplying section 12 is sucked by the transporting device 16, and transported to the stand-by position 42A on the index table 42, and the positioning thereof in the longitudinal direction is performed by the frame positioning mechanism 17. Thereafter, the lead frame 21 is held on the support sections 43 and 44 by the dampers 56 and 57. In this condition, the image of the lead frame 21 before the laser marking is detected by the image detecting device 19.

The image detecting device 19 has a CCD camera and a ring illuminator which pick up, for instance, the region A of FIG. 3. Then, the portion corresponding to the region B is image-processed by the controlling section 25 to thereby detect the elongated holes 22a and to determine the top and bottom and direction of the lead frame 21. Also, the lead pitch is detected by image processing the portion corresponding to the region C and the type of lead frame 21 is confirmed.

By rotating the index table 42 through 180° after image detection by the image detecting device 19, the lead frame 21 before laser marking is conveyed to the processing position 42B, and the laser marking process is effected on all the package portions 23 by the laser irradiating section 18. After the process, the index table 42 is reversed through 180°, and the lead frame 21 after processing is moved to the stand-by position 42A. Then, the absence or presence of the mark is detected by the image detecting device 19. Incidentally, in the case where an abnormality is detected in the image detection before and after the process, an error is displayed on the monitor 20A and the operation of the apparatus is stopped.

Thereafter, the lead frame 21 after the process is transported into the magazine 15 of the discharging section 13 by the suction pad group 82B of the transporting device 16. Simultaneous with transporting the lead frame 21 after the process, the next lead frame 21 from the supplying section 12 is transported to the stand-by position 42A by the suction pad group 82A of the same transporting device 16.

Also, the transportation of the lead frame 21 before the laser marking process from the supplying section 12 to the stand-by position 42A, the transportation of the lead frame 21 after the process from the stand-by position 42A to the discharging section 13, the positioning of the lead frame 21 at the stand-by position 42A and the image detection by the image detecting device 19 are all performed during the laser marking processing of the lead frame 21 located at the processing position.

Furthermore, the lead frames 21 within the magazine 15 are gradually pushed upward by the frame lifter 38 in the supplying section 12. Then, when the magazine 15 becomes empty, the frame lifter 38 is moved downwardly below the magazine table 32, and at the same time, the magazine positioning claws 36 are opened. The magazine table 32 is moved by the motor 34 until the next magazine 15 is located at a position above the frame lifter 38.

Furthermore, in the discharging section 13, whenever a lead frame 21 is conveyed after the processing, the frame lifter 38 is gradually moved downwardly. Then, when the lead frames 21 after the process fully occupy the magazine 15, the frame lifter 38 is moved downwardly below the magazine table 32, and the magazine positioning claws 36 are opened. The magazine table 32 is moved by the motor 34 until the next vacant magazine 15 is located at a position above the frame lifter 38.

Also, in the case where the width of the lead frame 21 is to be changed, type-change information for the lead frame 21 is input into the controlling section 25 so that the stepping motor 48 is driven on the basis of the information stored in advance. As a result, the distance between the frame receivers 43a and 43b and the distance between the frame receivers 44a and 44b are automatically changed. Furthermore, in the case where the number or the arrangement of the package portions 23 is changed in accordance with a change in type of lead frame 21, as described above, the intervals between all the suction pads 82 of the transporting device 16 are automatically changed. Moreover, in the case where the length of the lead frames 21 is changed, the stop position of the positioning claws 69 and 70 of the frame positioning mechanism 17 is automatically changed.

In the thus constructed laser marking apparatus, by using the index table 42 the pre-process stand-by position 42A of the lead frame 21 supplied from the supplying section 12 and the post-process stand-by position 21A of the lead frame 21 to be discharged to the discharging section 13 may be the same, and further, the number of transporting devices 16 need only be one to thereby allow the size of the overall apparatus to be compact.

Also, since the positioning of the lead frame 21 to the support sections 43 and 44 is performed at the stand-by position 42A during the laser marking process, the lead frame 21 that has been conveyed to the processing position 42B may be immediately subjected to the laser marking process to thereby shorten the processing time. Furthermore, since the dampers 56 and 57 for holding the lead frame 21 are provided on the support sections 43 and 44, shifting of the lead frame 21 after positioning is prevented and it is therefore possible to rotate the index table 42 at a high rotational speed to thereby reduce processing time.

Furthermore, since the interval between the frame receivers 43a and 43b and the interval between the frame receivers 44a and 44b are automatically changed in response to the width of a lead frame 21, it is possible to perform a setting change process in a short period of time when the type of lead frame 21 is changed.

Also, since the top and bottom of the lead frame 21 may be determined by the image detecting device 19, the type of lead frame 21 may readily be confirmed by detecting the lead pitch. Furthermore, since the detection by the image detecting device 19 is performed at the stand-by position 42A during the laser marking process, the processing time may be further shortened. Furthermore, it is possible to readily detect the absence or presence of a mark after the later marking process.

Various details of the invention may be changed without departing from the spirit or scope thereof. Furthermore, the foregoing description of the embodiments according to the present invention is provided for the purpose of illustration only, and not for the purpose of limiting the invention as defined by the appended claims and their equivalents.

What is claimed is:

1. A laser marking apparatus comprising:
    a supplying section for supplying a plurality of lead frames into which IC devices are molded;
    an index unit having a rotatable index table provided with first and second support sections for supporting the lead frames that have been supplied from said supplying section, for alternately switching positions of said first and second support sections between a stand-by position and a processing position by rotating said index table;
    a laser irradiating section for performing a laser marking process at the processing position to surfaces of the IC packages of the lead frames supported by said first and second support sections;
    a discharging section for receiving the lead frames that have been processed by said laser marking;
    a transporting device for transporting the lead frames, after the laser marking process, from the stand-by position to said discharging section and transporting the lead frames, before the laser marking process, from said supplying section to the stand-by position; and
    a controlling section for controlling operation of said supplying section, said index unit, said laser irradiating section, said discharging section and said transporting device.

2. The laser marking apparatus according to claim 1, further comprising a frame positioning mechanism controlled by said controlling section for positioning the lead frames in a longitudinal direction on said first and second support sections at the stand-by position.

3. The laser marking apparatus according to claim 2, wherein said first and second support sections are provided with dampers for holding the lead frames.

4. The laser marking apparatus according to claim 3, wherein each damper is pivotable between an open position and a closed position in which the clamper can prevent shifting of a lead frame with respect to one of said support sections when said index table is rotating.

5. The laser marking apparatus according to claim 2, wherein said frame positioning mechanism includes a pair of frame positioning claws movable towards and away from each other into and out of contact with lengthwise ends of a lead frame at the stand-by position.

6. The laser marking apparatus according to claim 5, wherein said frame positioning claws are movable toward snad away from each other along a linear path.

7. The laser marking apparatus according to claim 1, wherein said first and second support sections have pairs of frame receivers whose intervals are adjustable, the intervals being automatically adjusted in response to a width of the lead frames by said controlling section.

8. The laser marking apparatus according to claim 1, wherein said support sections are movable by said index table along a circular path between the stand-by position and the processing position.

9. The laser marking apparatus according to claim 8, wherein the stand-by position and the processing position are spaced from each other by 180° around a rotational axis of said index table.

10. The laser marking apparatus according to claim 1, wherein said supplying section is adapted to accommodate a magazine for lead frames to be processed by said laser irradiating section and said discharging section is adapted to accommodate a magazine for lead frames which have been processed by said laser irradiating section, said index table being rotatable with respect to said supplying section and said discharging section.

11. A laser marking apparatus comprising:
    a supplying section for supplying a plurality of lead frames into which IC devices are molded;
    an index unit having a rotatable index table provided with first and second support sections for supporting the lead frames that have been supplied from said supplying section, for alternately switching positions of said first and second support sections between a stand-by position and a processing position by rotating said index table;

a laser irradiating section for performing a laser marking process at the processing Position to surfaces of the IC packages of the lead frames supported by said first and second support sections;

a discharging section for receiving the lead frames that have been processed by said laser marking;

a transporting device for transporting the lead frames, after the laser marking process, from the stand-by position to said discharging section and transporting the lead frames, before the laser marking process, from said supplying section to the stand-by position;

an image detecting device for determining the kind and top and bottom of the lead frames positioned at the stand-by position; and a controlling section for controlling operation of said supplying section, said index unit, said laser irradiating section, said discharging section and said transporting device.

12. The laser marking apparatus according to claim 11, wherein a mark, after the laser marking process, is detected by said image detecting device.

* * * * *